United States Patent
Cabrera et al.

(10) Patent No.: US 8,833,256 B2
(45) Date of Patent: Sep. 16, 2014

(54) PAD MICROPRINTING DEVICE AND METHODS, AND PAD FOR THIS DEVICE

(75) Inventors: Michel Cabrera, Lyons (FR); Elie Bou Chakra, Lyons (FR)

(73) Assignees: Ecole Centrale de Lyon, Ecully (FR); Centre National de la Recherche Scientifique, Paris (FR)

( * ) Notice: Subject to any disclaimer, the term of this patent is extended or adjusted under 35 U.S.C. 154(b) by 1085 days.

(21) Appl. No.: 12/740,376

(22) PCT Filed: Oct. 13, 2008

(86) PCT No.: PCT/EP2008/063739
§ 371 (c)(1),
(2), (4) Date: Apr. 29, 2010

(87) PCT Pub. No.: WO2009/056440
PCT Pub. Date: May 7, 2009

(65) Prior Publication Data
US 2010/0236433 A1    Sep. 23, 2010

(30) Foreign Application Priority Data
Oct. 31, 2007  (FR) ...................................... 07 07691

(51) Int. Cl.
*B41K 99/00*    (2006.01)
*B82Y 10/00*    (2011.01)
*G03F 7/00*    (2006.01)

(52) U.S. Cl.
CPC ............... *G03F 7/0002* (2013.01); *B82Y 10/00* (2013.01); *B85Y 40/00* (2013.01)
USPC ......................................................... 101/395

(58) Field of Classification Search
None
See application file for complete search history.

(56) References Cited

U.S. PATENT DOCUMENTS

| 5,817,242 | A | 10/1998 | Biebuyck et al. |
| 6,013,446 | A | 1/2000 | Maracas et al. |
| 7,533,905 | B2 * | 5/2009 | Jackson et al. ................ 283/117 |
| 2006/0137554 | A1 | 6/2006 | Kron et al. |
| 2006/0273147 | A1 * | 12/2006 | Jackson et al. ................ 235/375 |

FOREIGN PATENT DOCUMENTS

| EP | 1726991 | 11/2006 |
| WO | WO97/06012 | 2/1997 |
| WO | WO02/067055 | 8/2002 |
| WO | WO2006/096123 | 9/2006 |

OTHER PUBLICATIONS

Tien et al. "Fabrication of Aligned Microstructures with a Single Elastomeric Stamp" PNAS, 99(4): pp. 1758-1762 (2002).

Gu et al. "A New Approach to Fabricating High-density Nanoarrays by Nanocontact Printing" J Vac Sci Technol B Microelectron Nanometer Struct Process Meas Phenom, 26(6): pp. 1860-1865 (2008).

* cited by examiner

*Primary Examiner* — Joshua D Zimmerman
(74) *Attorney, Agent, or Firm* — Occhiuti & Rohlicek LLP

(57) ABSTRACT

This pad microprinting device comprises:
  a multi-level pad (34) wherein the printing pattern is made out of elastomeric material for which the Young's modulus is between 0.1 and 100 MPa, and
  a stop mechanism (62-64) capable of keeping an incompressible space of a thickness $D_n$ between the nth flat bottom (122B) and the face of the substrate (32) on which an imprint has to be printed, when the pad is compressed against the face of the substrate to print off the imprint, the thickness $D_n$ being between $h_n/2$ and $h_n+100$ nm where $h_n$ is the height of the protrusions of the printing pattern.

13 Claims, 7 Drawing Sheets

Figure 1:
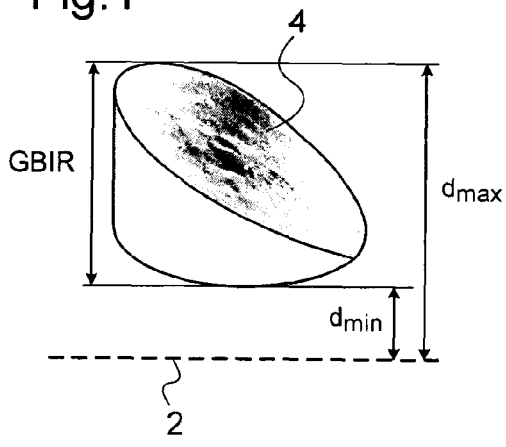

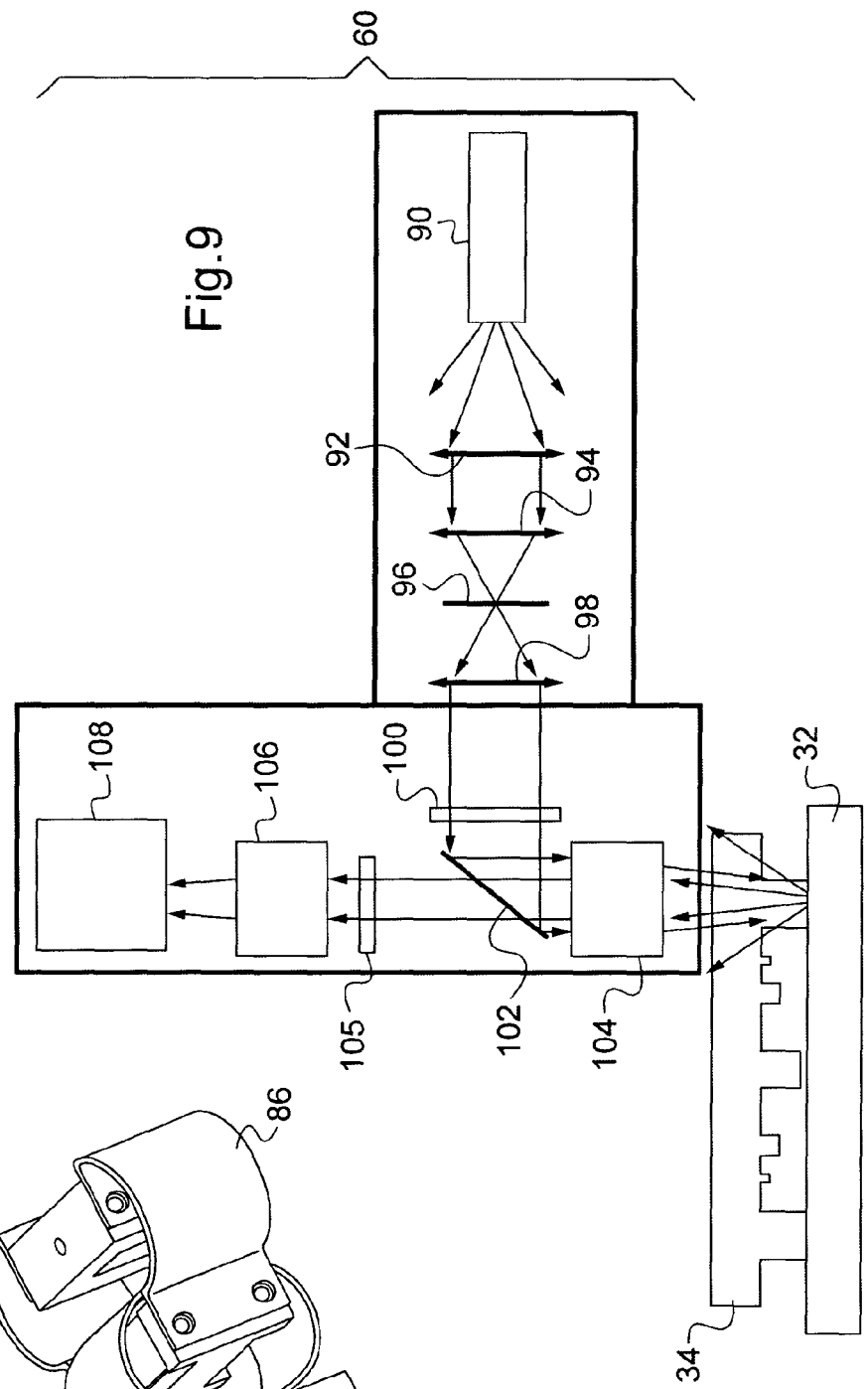
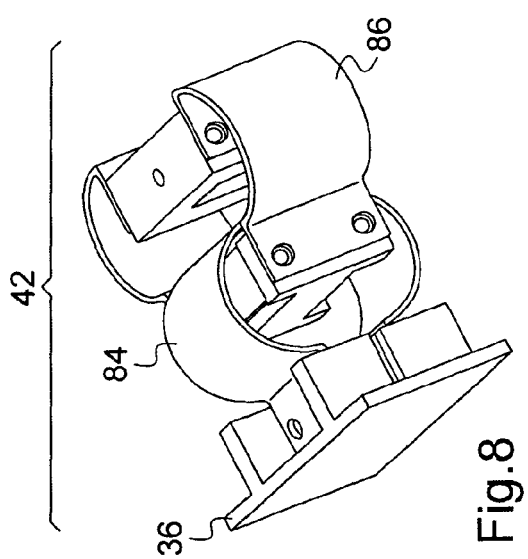
Fig.8
Fig.9

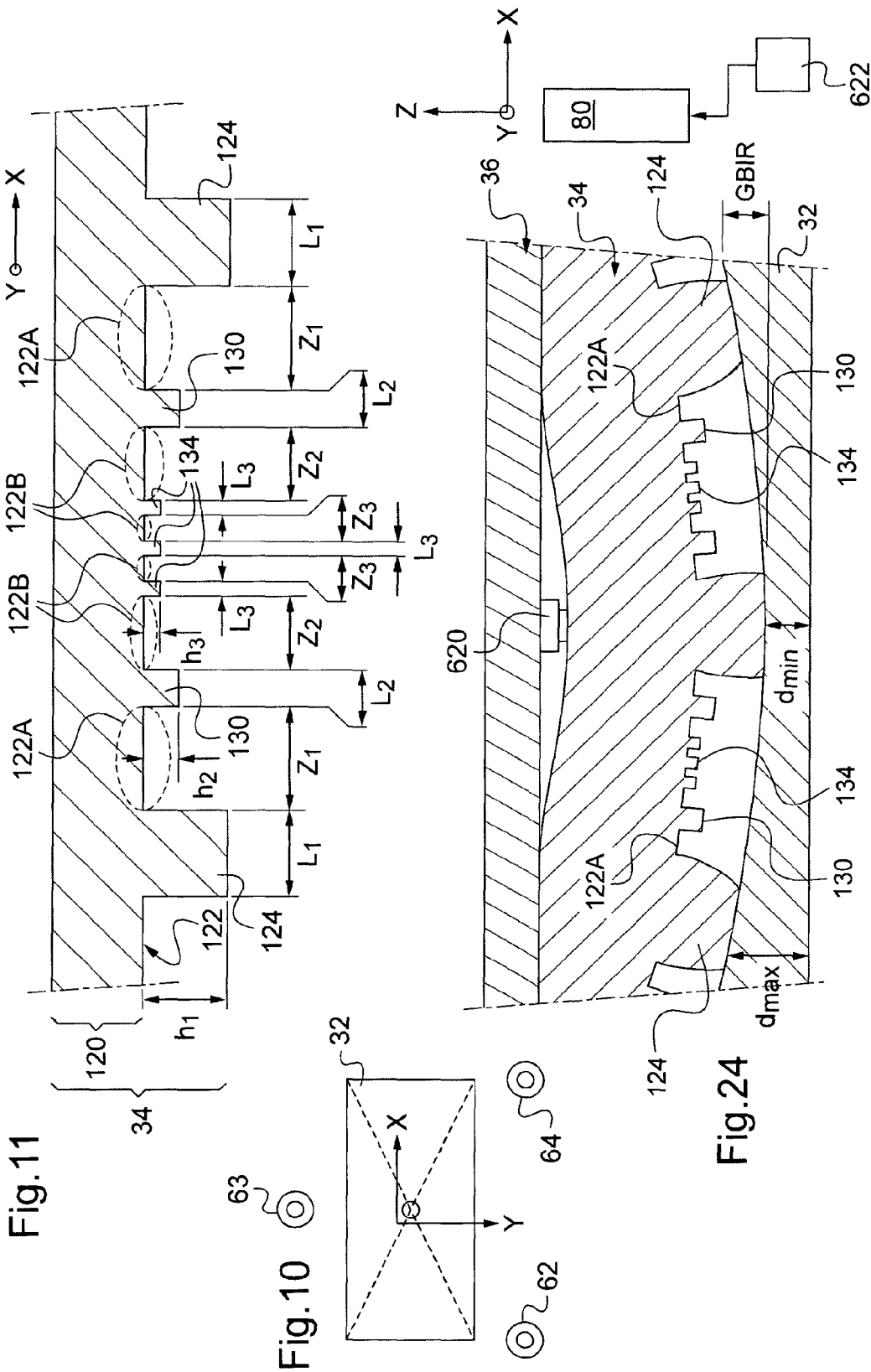

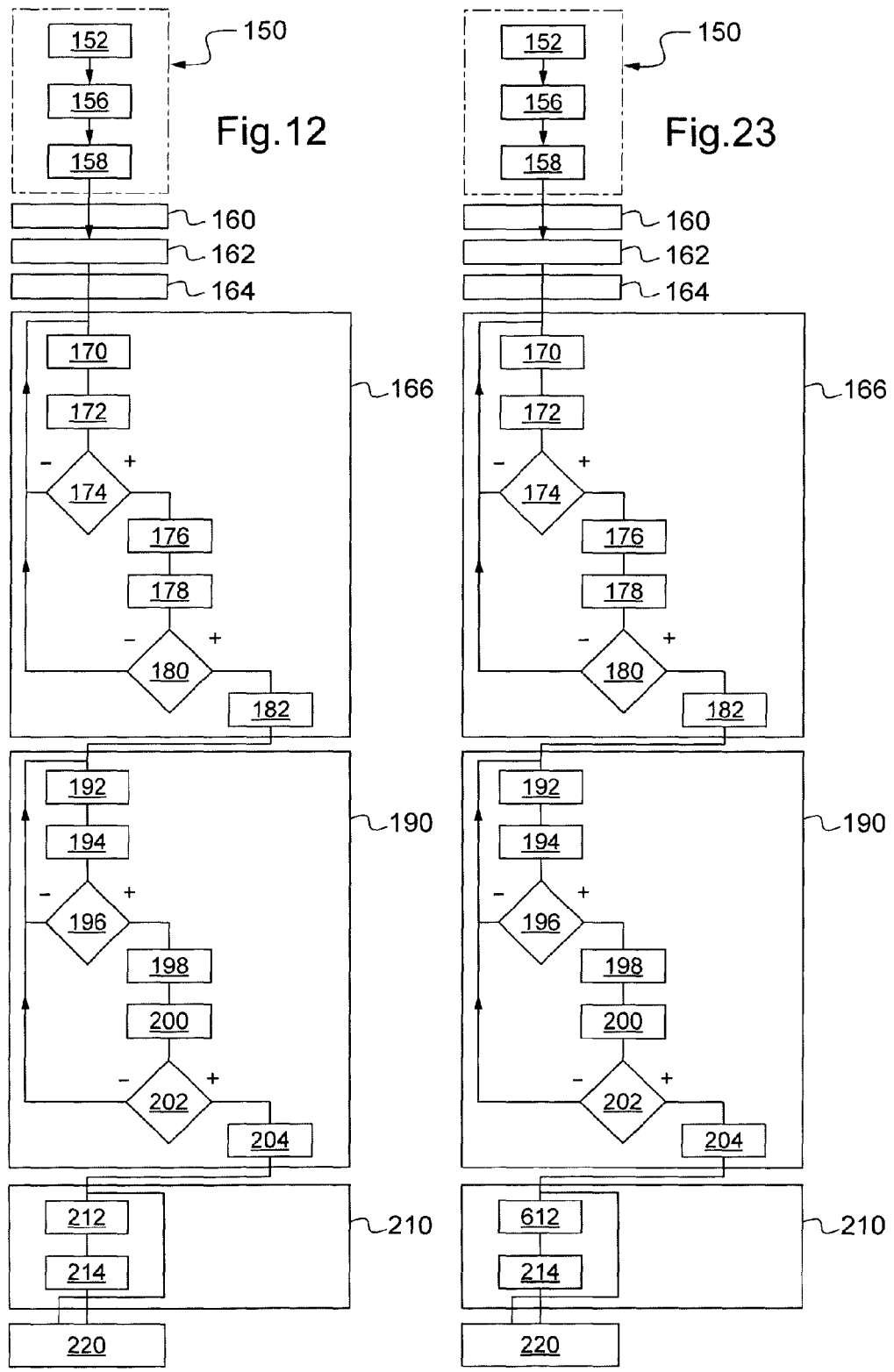

PAD MICROPRINTING DEVICE AND METHODS, AND PAD FOR THIS DEVICE

CROSS-REFERENCE TO RELATED APPLICATIONS

This application is the National Stage of International Application No. PCT/EP2008/063739, filed on Oct. 13, 2008, which claims the priority of French Application No. 077691, filed on Oct. 31, 2007. The contents of both applications are hereby incorporated by the reference in their entirety.

The invention pertains to a pad microprinting device, a pad for this device and pad microprinting methods.

Pad microprinting devices comprise a substrate and a pad capable of printing an imprint on one face of this substrate.

The Applicant knows pads comprising:
a layer of elastomeric material having a first flat bottom from which there protrude n successive levels of embossed patterns, classified in descending order of height $h_i$, where n is an integer greater than or equal to two and the index i represents the pattern level with i being equal to one for the pattern for which the height $h_i$ is the greatest,
a first pattern level, called a conformation level, enabling the first flat bottom to be coarsely parallelized with the face of the substrate, this pattern being formed by several protrusions of a height $h_1$, these protrusions defining at least three non-collinear support points on said face and around the first flat bottom, the height $h_1$ being measured relative to this first flat bottom and in a direction perpendicular to this first flat bottom, and
an nth pattern level, called a printing level, capable of coming into contact with the face of the substrate solely after the (n−1)th pattern level has thus been put into contact with this face, to print the imprint on the face of the substrate, this pattern being formed by one or more protrusions with a height $h_n$ projecting perpendicularly from an nth flat bottom which is the same as or is parallel to the first flat bottom and situated between the three supporting points of the first pattern level, the height $h_n$ being included between $h_{n-1}/2$ and $0.5 \times SFQR_{max}$, where $SFQR_{max}$ (Max Site Frontside least sQuare focal plane Range) is a standardized measurement of the flatness of the substrate, the height $h_n$ of each protrusion being measured relative to the nth bottom plate and perpendicularly to this nth bottom plate.

The measurements of the flatness of the substrate such as the GBIR (Global Backside Ideal focal plane Range), $SBIR_{max}$ (Max Site Backside Ideal focal plane Range) and $SFQR_{max}$ are defined in the following standards: DIN 50441-1, SEMI MF1530 and SEMI M1. Only a brief description of these measurements is given herein. For further information the reader may refer to the text of these standards.

The GBIR or TTV (Total Thickness Variation) measurement was defined through the following relationship:

$$GBIR = d_{max} - d_{min}$$

where:
$d_{max}$ and $d_{min}$ are respectively the maximum and minimum thicknesses of the substrate measured relative to a plane of reference.

The GBIR measurement is shown in FIG. 1. In this figure, the reference plane is constituted by a flat bottom 2 on which the substrate is held. The bottom 2 is represented by a line of dashes. A portion 4 of the upper surface of the substrate is also illustrated.

Figure 2:
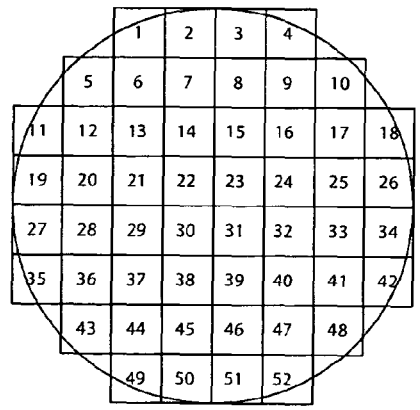

The SBIR or LTV measurement is a local measurement of the flatness of the substrate. For this measurement, the surface of the substrate is divided into sites. FIG. 2 represents an example of a substrate 6 whose surface is divided into 52 sites.

For each site i, the SBIR measurement is given by the following relationship:

$$SBIR_i = d_{max} - d_{min}$$

where:
$d_{max}$ and $d_{min}$ are respectively the maximum and minimum thicknesses of the substrate at the site i relative to a reference plane herein constituted by the bottom of the substrate.

Figure 3:
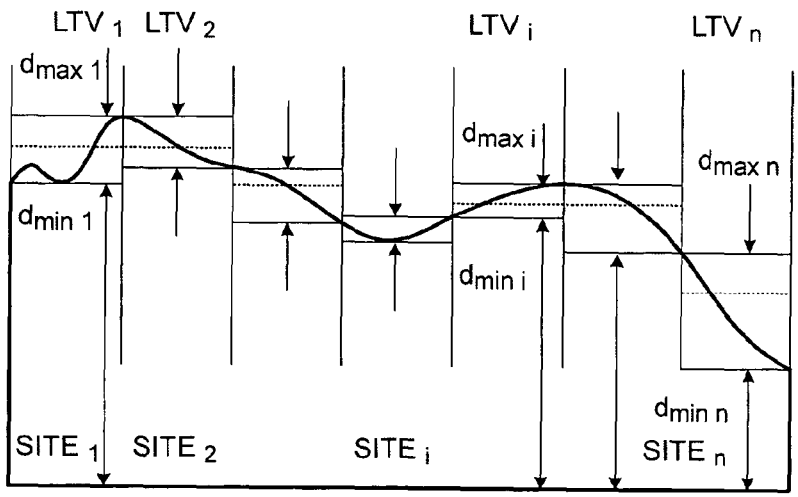

The thicknesses $d_{min}$ et $d_{max}$ are represented for n sites in FIG. 3.

The measurement $SBIR_{max}$ is given by the following relationship: $SBIR_{max} = \max[SBIR_1, SBIR_2, \ldots, SBIR_i, \ldots, SBIR_n]$.

Finally, the $SFQR_i$ (Site Frontside least sQuare focal plane Range) measurement is a local measurement on the site i of the flatness of the surface of the substrate. This measurement $SFQR_i$ is given by the following relationship:

$$SFQR_i = |x| + |y|$$

where:
|x| is the absolute value of the maximum protuberance relative to a reference plane known as a "focal plane" and
|y| is the absolute value of the depth of the greatest dip relative to the reference plane.

For example, the position of the reference plane is determined by the least error squares method to minimize the differences of the surface of the substrate relative to this plane.

Figure 4:
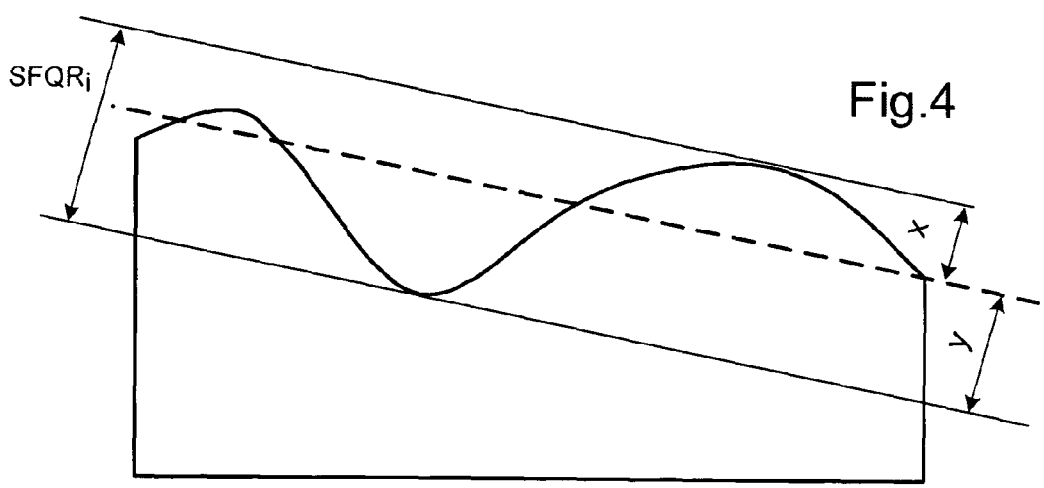

To illustrate the definition of the values x and y, these values are represented for a single site i in FIG. 4. In this figure, the reference plane is represented by a line of dashes.

The measurement $SFQR_{max}$ is given by the following relationship:

$$SFQR_{max} = \max[SFQR_1, SFQR_2, \ldots, SFQR_i, \ldots SFQR_n].$$

The term "flat bottom" is also used to define a smooth surface with no rough features and having a height greater than $h_n/10$ except for the embossed patterns which are deliberately built on this bottom.

A multi-level pad is disclosed in the U.S. Pat. No. 5,817,242 (see FIG. 8). In this document, the pad comprises solely one first conformation pattern level and one printing pattern level. The protrusions of the first pattern level are made out of elastomeric material and more specifically PDMS (poly(dimethylsiloxane)). However, the printing pattern is made out of a much harder material, i.e PMMA (poly(methyl methacrylate)). The Young's modulus of PMMA ranges from 1.8 to 3.1 GPa. The use of PMMA prevents the crushing of the protrusions of the printing pattern during pad printing. Indeed, excessive crushing of the protrusions of the printing pattern leads to an illegible imprint.

Figure 5:
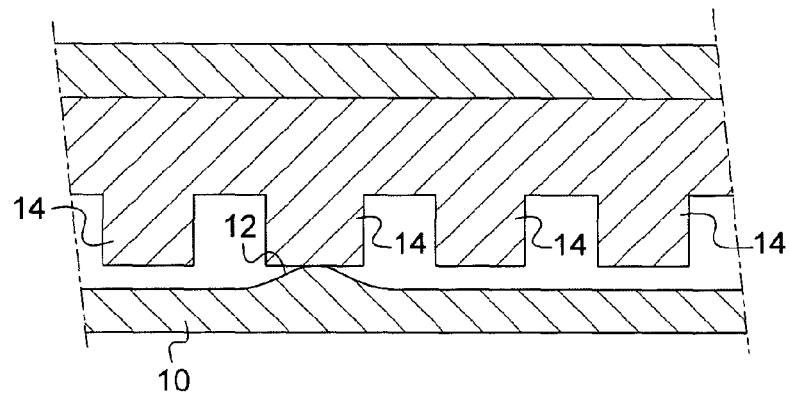

However, the hardness of the protrusions of the printing pattern introduces new problems. For example, this pad is extremely sensitive a local defect of flatness of the substrate such as a bump. An example of this situation is shown in FIG. 5. In FIG. 5, a substrate 10 has a bump 12. A few PMMA protrusions of the printing pattern of the pad are shown. As illustrated in this figure, because of the hardness of PMMA, the bump 12 of the substrate prevents a large number of protrusions from coming into contact with the face of the substrate. Thus, the quality of the print made with this pad is highly sensitive to the presence of local defects of flatness, especially submicrometric defects.

Figure 6:
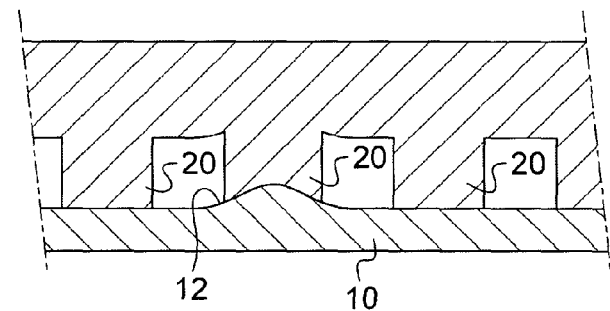

The invention is aimed at overcoming this drawback by proposing a pad microprinting device that is less sensitive to local defects of flatness of the substrate. An object of the invention therefore is a pad microprinting device in which:

the printing pattern is made out of elastomeric having a Young's modulus between 0.10 and 100 MPa, an the device has a stop mechanism capable of keeping an incompressible space of a thickness $D_n$ between the nth flat bottom and the face of the substrate when the pad is thrust against the face of the substrate to print off the imprint, the thickness $D_n$ being between $h_n/2$ and $h_n+100$ nm. Using the pad mentioned here above, as illustrated in FIG. 6, when the printing pattern is applied against the same bump 12 as the one described with reference to FIG. 5, the printing pattern, which is made of elastomeric instead of PMMA gets locally deformed, thus enabling the application to the substrate of the protrusions 20 which are to the right and to the left of the bump 12. In FIG. 6, only the printing pattern is shown. The crushing of the printing pattern is prevented through the stop mechanism makes it possible to control the load exerted by the pad during the contact with very high resolution in preventing this pattern from being crushed over more than half of its height $h_n$. Thus, the pad microprinting device described here is less sensitive to local defects of flatness of the substrate. Furthermore, this pad is used to make submicrometric prints in a more controlled manner than with the pad described in the U.S. Pat. No. 5,817,242 which relies solely on the rigidity of the printing pattern to prevent it from being crushed during a microprinting.

In practice, it is particularly advantageous to use multi-level pads by adding levels of conformation patterns supplementary the level n printing pattern at heights of over $h_i$ with i=1 to n−1. Indeed, as explained further below, these supplementary patterns facilitate the setting of the microprinting device and the implementing of the method.

The embodiments of this microprinting device may comprise one or more of the following characteristics:

The stop mechanism is also capable of stopping the pad in a position where the space of thickness $D_i$ separates firstly the face of the substrate and secondly an ith flat bottom which is the same as or is parallel to the first flat bottom, from which there protrude the level i protrusions of a height $h_i$, the thickness $D_i$ being included between $h_i/2$ and $h_i$ and i being included between 1 and n−1.

The stop mechanism comprises at least three stops having heights adjustable independently of one another and being placed along at least two non-collinear axes so that the adjusting of the heights of each stop modifies the tilt of the entire pad relative to the face of the substrate.

The device comprises:

a difference sensor capable of detecting or measuring a variable representing the parallelism of an ith flat bottom which is the same as or is parallel to the first flat bottom and from which there protrude protrusions of height $h_i$ of the level i, and an electronic computer capable of automatically adjusting the height of the stops as a function of this variable detected or measured by the sensor to parallelize the ith flat bottom with the face of the substrate.

The device comprises:

A pad-holder on one face of which is fixed the pad or a substrate-holder on one face of which is fixed the substrate, the pad-holder and the substrate-holder having a Young's modulus of over 1 GPa, at least one stop controllable taking support firstly on said face of the pad-holder and secondly on the pad or firstly on said face of the substrate and, secondly, on the substrate-holder, this stop being capable, at the level of the supporting points, of locally deforming the curvature of the pad or of the substrate, with an adjustable amplitude, in a direction parallel to the direction of compression of the pad on the substrate, a sensor of defects of flatness of the face of the substrate on which the imprint has to be printed or of defects of the face of the pad bearing the printing pattern, and a computer capable of controlling the controllable stop as a function of the measurements of the flatness defect sensor to adjust the amplitude of the local deformation as a function of the flatness defect.

These embodiments of the microprinting device furthermore have the following advantages:

being able to stop the pad in a position where only one or more conformation patterns are in contact with the substrate allows the pad time to get deformed before printing the imprint on the face of the substrate by means of the printing pattern, the presence of at least three motor-driven stops having heights adjustable independently of one another makes it possible to adjust the overall tilt of the pad relative to the face of the substrate, the use of a difference sensor and the automatic setting of the height of the stops as a function of the data transmitted by this sensor enables the automatic setting of the tilt of the pad relative to the face of the substrate, and the use of adjustable stops between the pad-holder and the pad or between the substrate-holder and the substrate makes it possible to compensate for the local defects of flatness of the substrate or of the pad.

An object of the invention is also a pad designed to be implemented in the above microprinting device.

The embodiments of this pad may include one or more of the following characteristics:

The pad comprises at least one intermediate level i of conformation patterns used to achieve a more precise parallelization of the nth flat bottom with the face of the substrate on which the imprint must be printed, each intermediate level i being formed by several protrusions of a height $h_i$ above the standardized SBIR (Site Backside Ideal focal plane Range) measurement of flatness of the substrate and below $h_{i-1}/2$ where $h_{i-1}$ is the height of the protrusions of level i−1 just greater than the conformation pattern, these protrusions defining at least three non-collinear supporting points arranged around the nth flat bottom.

The pad has at least one air escape channel linking a space, situated between the protrusions of each pattern level, to the exterior of the pad in order to enable air likely to be imprisoned between the substrate and the pad to escape out of the pad when the pad is thrust against the face of the substrate.

the height $h_n$ is smaller than or equal to 100 micrometers and preferably smaller than or equal to 1 micrometer or 0.3 micrometers.

The embodiments of this pad furthermore have the following advantages:

The use of an intermediate level of conformation pattern improves the parallelism between the (n−1)th flat bottom and the face of the substrate, and this ultimately improves the sharpness of the imprint, the presence of escape channels prevents the trapping of air bubbles between the pad and the substrate, thus improving the quality of the imprint, printing patterns whose height $h_n$ is smaller than one micrometer enable the making of an imprint comprising patterns of which the smallest width is smaller than one micrometer.

An object of the invention is also a method for contactless printing of an imprint on the face of a substrate by pad microprinting using the above device, this method comprising:

the maintaining of a incompressible space of thickness $D_n$ between the nth flat bottom and the face of the substrate when the pad is thrust against the face of the substrate to print the imprint, the thickness $D_n$ being included between $h_n+1$ nm and $h_n+100$ nm to enable an ink deposited on the end of each protrusion of the printing pattern to go through this incompressible space of thickness $D_n$, then the moving of the pad away from the face of the substrate without the protrusion or protrusions of the printing pattern being placed in direct contact with the face of the substrate. In the above method, since the thickness $D_n$ ranges from $h_n+1$ nm to $h_n+100$ nm, the printing pattern is kept above the face of the substrate at a distance of between 1 nm and 100 nm. This distance is small enough to enable the ink that covers the printing pattern to cross this space of a thickness $D_n$ in order to form the imprint on the face of the substrate. However, in this embodiment, given that the protrusions of the printing pattern do not come into direct contact with the face of the substrate, this face is not deformed, thus improving the quality of the print obtained. An object of the invention is also a method for printing an imprint on the face of a substrate by pad microprinting using the above pad microprinting device characterized in that the method comprises:

adjusting the stop mechanism to stop the compression of the pad on the substrate in a first position where one of the conformation pattern levels is directly supported on the face of the substrate while the nth flat bottom is separated from the face of the substrate by a distance strictly greater than $h_n+100$ nm, then adjusting the stop mechanism so that the compression of the pad on the substrate can continue until a second position of the nth flat bottom is at a distance from the face of the substrate equal to the incompressible space of thickness $D_n$.

The embodiments of this method can include one or more of the following characteristics:

Before the protrusions of a pattern level i are brought into contact, the method comprises:

holding level i−1 protrusions in a supported position on the face of the substrate and, at the same time adjusting the height of each motor-driven stop of the stop mechanism to parallelize the ith flat bottom, demarcated by the I level pattern protrusions, with the face of the substrate.

The method comprises:

detecting or measuring a variable representing the parallelism of an ith flat bottom which is the same as or is parallel to the first flat bottom and from which there protrude protrusions of height $h_i$ of the level i, and adjusting the height of each motor-driven stop as a function of the detected or measured variable in order to parallelize the ith flat bottom with the face of the substrate.

These embodiments of the pad microprinting method furthermore have the following advantages:

stopping the motion of the pad when only one part of the conformation pattern levels is directly supported on the face of the substrate allows time for the pad to get deformed before carrying out an additional crushing of this pad, and this ultimately improves the quality of the imprint, adjusting the stops so as to improve the parallelism between a pattern level and the face of the substrate before carrying out an additional crushing of the pad improves the quality of the imprint obtained, adjusting the height of each stop as a function of the detection of measurement of the differences between the protrusions and the face of the substrate automatically adjusts the height of the stops to adjust the parallelism between the pad and the face of the substrate before carrying out an additional crushing of this pad.

Figure 7:
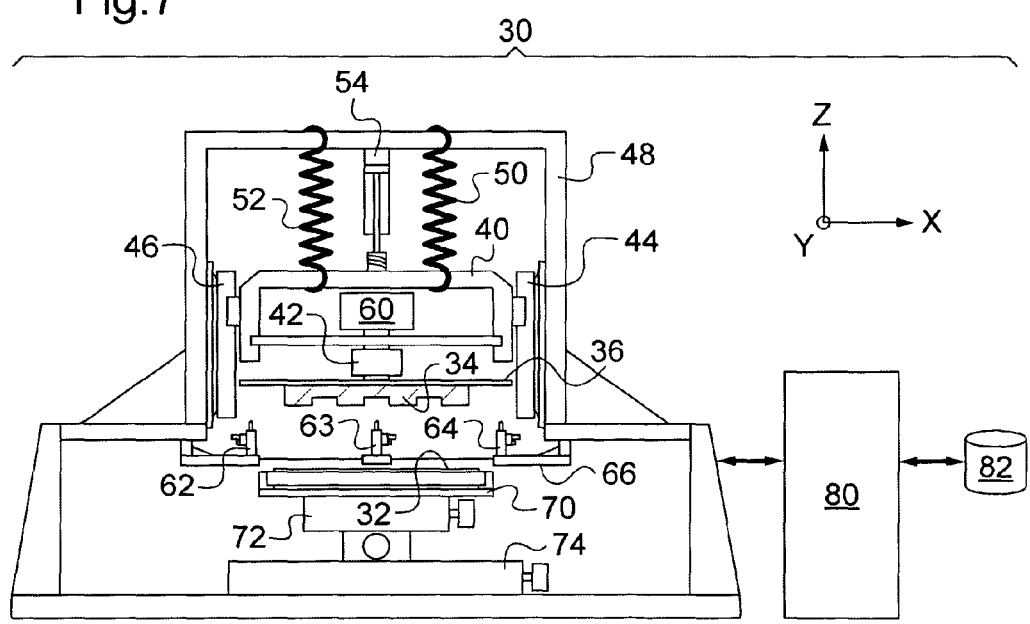
Figure 13:
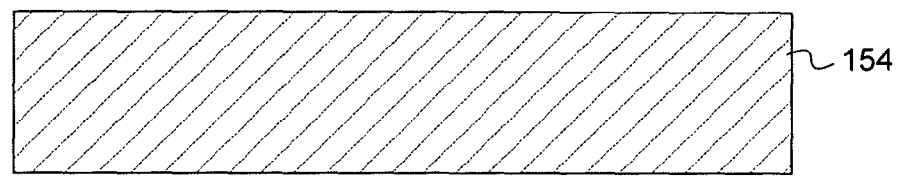
Figure 14:
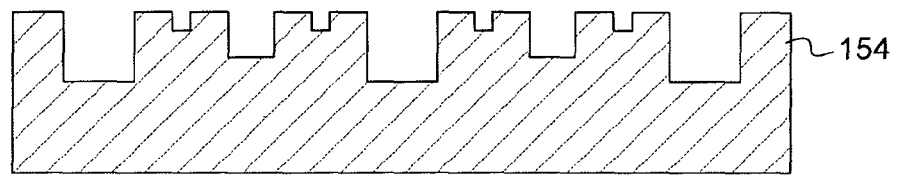
Figure 15:
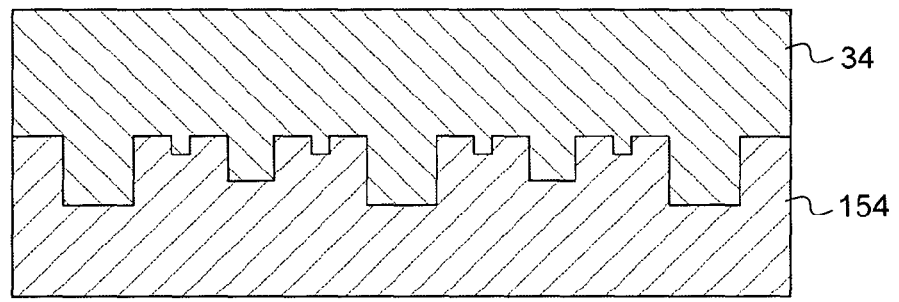

The invention will be understood more clearly from the following description, purely by way of a non-restrictive example and made with reference to the appended drawings of which:

FIG. 1 is a schematic illustration of the GBIR measurement,

FIG. 2 is a schematic illustration of the sub-division of the surface of a substrate into several sites, FIG. 3 is a schematic illustration of the $SBIR_i$ measurement, FIG. 4 is a schematic illustration of the $SFQR_i$ measurement on a particular site of the substrate, FIG. 5 is a schematic and partial illustration of the of a prior art pad, FIG. 6 is a schematic and partial illustration of a printing pattern made out of elastomeric material FIG. 7 is a schematic illustration of the structure of a pad microprinting device, FIG. 8 is a more detailed 3D illustration of a hinge system used in the device of FIG. 7, FIG. 9 is a schematic illustration of a difference sensor used in the device of FIG. 7, FIG. 10 is a top view of the positioning of the motor-driven stops used in the device of FIG. 7, FIG. 11 is a schematic illustration of a vertical section of a multi-level pad used in the device of FIG. 7, FIG. 12 is a flowchart of a method of pad microprinting using the device of FIG. 7, FIGS. 13 to 18 are schematic illustrations of certain particular steps of the method of FIG. 12, FIGS. 19 to 22 represent other different possible embodiments of a multi-level pad that can be used in the device of FIG. 7, FIG. 23 represents a flowchart of another embodiment of the pad microprinting method of FIG. 13, and FIG. 24 is a schematic view in section of a detail of a variant of the device FIG. 7.

In these figures, the same references are used to designate the same elements.

Here below in this description, the characteristics and functions well known to those skilled in the art shall not be described in detail.

FIG. 7 shows a pad microprinting device 30. The device 30 described here is designed for the printing, on a substrate 32, of an imprint whose patterns must have widths of less than 100 micrometers. Typically, the machine described here can be used to obtain patterns whose width is below one micrometer or 500 nm or even below 50 nm. At these scales, the applications concern, for example and non-restrictively: micronanotechnology, microelectronics and microphotonics. However this device can also be used in nano-biotechnology microapplications, surface chemistry and microfluidic chemistry which require patterns of up to 100 μm.

The device 30 is placed on a horizontal plane X,Y and extends upwards along a vertical direction Z.

The device 30 has a pad 34 made of elastomeric material. The pad 34 is described in greater detail with reference to FIG. 11.

This pad 34 is fixed without any degree of freedom to a pad-holder 36 made out of rigid materials. Here below, the term "rigid" shall be applied to a material for which the Young's modulus is greater than 1 GPa and preferably greater than 60 GPa. For example, the pad-holder 36 is made of aluminum or steel. The pad-holder 36 is a rectangular plate extending essentially in parallel to the plane X,Y. The pad-holder 36 is fixed on a sliding rigid support or trolley 40 by means of a hinge 42. The hinge 42 is described in greater detail with reference to FIG. 8.

The trolley 40 is mounted so as to be sliding solely in the direction Z. To this end, for example, the movements of the trolley 40 are guided by vertical sliders 44 and 46 which are precision vertical sliders. The vertical sliders 44 and 46 are fixed to a rigid frame 40 without any degree of freedom. The frame 48 rests on a horizontal surface.

The trolley 40 is moved upwards along the direction Z by a return mechanism herein formed by example by two return springs 50 and 52.

The downward movement of the trolley 40 along the direction Z is controlled by example by a controllable pneumatic jack 54. This jack 54 is capable of moving the trolley 40 against the pull-back force of the springs 50 and 52 to crush or compress the pad 34 against the substrate 32. Should the pad 34 be made out of a material transparent to visible light, a sensor 60 of difference between the pad 34 and the substrate 32 is installed in the trolley 40. An example of such a sensor 60 is described in greater detail with reference to FIG. 9.

The device 30 also has a stop mechanism formed herein by three motor-driven stops 62 to 64 extending along the direction Z. One end of each of the stops is fixed without any degree of freedom to a shoulder 66 of the frame 48. The shoulder or shoulders 66 are distributed in a horizontal plane. The opposite end of these stops 62 to 64 can come into a position where it is directly supported on the pad-holder 36 when this pad-holder is shifted downwards. The height of each of these stops is adjustable. To this end, each of these stops has a controllable activator used to adjust the height of each of the stops with a resolution of motion in the direction Z that is at least below $h_n/2$. Typically, its resolution is below $h_n/5$ and preferably below $h_n/10$. For example, the resolution of the motion of the stops in the direction Z is between 1 nm to 10 nm. In this case, the actuators are piezoelectric actuators.

This stop mechanism is used to very finely adjust the load or force exerted by the jack 54 on the pad 34. Indeed, in a state of equilibrium, the force exerted on the jack is fixed by the height of the stop 62 to 64. The force exerted by the jack is distributed between a first component on the pad 34, independent of the thrust exerted by the jack 54 on the pad-holder 36 and a second variable component on the stops 62-64. The stops 62-64 exert a reaction which is automatically added to the reaction of the pad 34 to balance the thrust of the jack 54 and also compensating for any variation or fluctuation of this thrust.

This principal considerably reduces the load exerted by the pad during contact between the pad and the substrate. Indeed, the load on the pad 34 is no longer dependent on the overall force exerted by the jack 54 on the pad-holder 36 but depends only on the height of the stops 62-64. It can then be adjusted with very high resolution, defined by the resolution of the setting of the movement of the stops. Thus, the invention removes the need to adjust the load exerted by the jack 54 with high resolution. On the contrary, it is possible to permanently exert high thrust, for example a thrust of over 1N, on the pad-holder 36, while the load is adjusted by piezoelectric actuators. For example, with a jack exerting a load of 1N, it is possible to put a 50×50 mm² pad 34 made of PMDS with heights $h_1$, $h_2$ and $h_3$ respectively equal to 10 μm, 1 μm and 100 nm in using three piezoelectric actuators with a travel of 20 μm and a resolution of 10 nm. The heights $h_1$, $h_2$ and $h_3$ are defined in greater detail with reference to FIG. 11.

The substrate 32 is mounted without any degree of freedom on a horizontal substrate-holder 70. The substrate-holder 70 can be moved in translation in the directions X and Y and rotationally about a vertical axis by the controllable actuators 72 and 75.

Finally, the device 30 includes an programmable electronic computer 80 capable of controlling the jack 54 as well as the different actuators of the device 30, and especially the actuators of the stops 62 to 64. The computer 80 is capable of executing instructions recorded on an information-recording medium. To this end, the computer 80 is connected to a memory 82 comprising the instructions needed to execute the method of FIG. 12.

FIG. 8 provides a more detailed representation of an example of an embodiment of the hinge 42. This hinge 42 enables the pad-holder 38 to pivot about any axis whatsoever contained in the plane of this pad-holder 36. Furthermore, this hinge 42 can stretch or be shortened like a spring in the direction Z. Here, by way of an example, this hinge 42 is formed by two rings 84 and 86 each made of an elastically deformable material. For example, the rings 84 and 86 are made out of metal. Each ring extends in a respective vertical plane. More specifically, the rings 84 and 86 extend respectively in orthogonal vertical planes. The rings 84 and 86 are fixed to each other without any degree of freedom.

FIG. 9 provides a more detailed view of an example of a difference sensor 60. The sensor is designed to work with a pad made out of elastomeric material transparent to visible light and showing low auto-fluorescence. For example, the material used to make the pad 34 is Sylgard 184® commercially distributed by the firm Dow Corning. The pad 34 has protrusions. The sensor 60, for each protrusion, measures the smallest difference between its end and the face of the substrate. These measurements therefore represent the parallelism between the flat bottom situated between these protrusions and the front face of the substrate 32. This sensor therefore makes possible especially to detect the contact of a protrusion with the substrate 32. Here, the end of these protrusions is covered by fluorescent material such as for example the CY3 fluorophore.

The sensor 60 has a visible light source 90. The visible light sent out by this source 90 is focused and concentrated by means of the different lenses 92, 94, then crosses a diaphragm 96 and is then collimated by a lens 98. The collimated light finally crosses a filter 100 and is then reflected by a semi-transparent mirror 102 towards the pad 34. The fluorescent light generated by the CY3 fluorophore crosses an objective 104 with high magnification focused on a point of the substrate and then a filter 105 capable of letting through solely light generated by the CY3 fluorophore. Indeed, the mirror 102 has a surface treatment which reflects the light emitted in the bandwidth of the filter 100 and lets through light emitted the bandwidth of the filter 105. The two bandwidths are distinct.

After the light generated by the CY3 fluorophore has been excited by the visible light, it crosses the objective 104, the mirror 102 and then the filter 105 and reaches an objective 106 which concentrates this fluorescent light on a photomultiplier 108. The closer a protrusion coated with CY3 fluorophore is to the face of the substrate, the greater is the increase in the light intensity picked up by the photomultiplier 108. This intensity reaches a maximum when a CY3 fluorophore coated protrusion comes into contact with a substrate 32. Thus, the difference between the end of a protrusion is measured, and the contact between this protrusion and the substrate 32 is detected on the basis of the light intensity received by the photomultiplier. The light intensity measured is also proportional to the area of the surface of the protrusion in contact with the substrate 32. This sensor 60 therefore also enables measurement or estimation of the area of the surface of this protrusion which is contact with a substrate 32.

Other difference sensors are described at the end of this description.

FIG. 10 is a top view of a substrate 32. Here, the substrate 32 is a rectangular plate, for example made of silicon. The stops 62 to 64 are arranged in a circle, the centre of which is situated within the rim of the substrate 32. For example, the center of the circle on which the stops 62 to 64 are situated is the same as the center of the substrate 32. Here, the stops 62 to 64 are laid out at the same distance from one another.

FIG. 11 provides a more detailed view of a portion in a section along a plane X, Y of the pad 34. Typically, the portion shown is repeated several times in the direction X.

The pad 34 is made here out of a homogenous elastomeric material, the Young's modulus of which is between 0.1 MPa and 100 MPa. The term "homogenous elastomeric material" designates a material for which the Young's modulus is constant in the directions X, Y and Z. Preferably, the pad 34 is made out of an elastomeric material with its Young's modulus between 1 and 10 Mpa. For example in this case, the pad 34 is made out of a PDMS (poly(dimethylsiloxane)). More specifically, the pad 34 is made out of one of the following PDMS materials:

Sylgard 184® for which the Young's modulus is equal to 1.8 MPa,
PDM-h for which the Young's modulus is equal to 9 MPa,
Rhodorsil RTV 3255 by the firm Rhodia equal to 4.4 MPa, and
Photocurable PDM-hυ for which the Young's modulus is equal to 3.4 MPa after photopolymerization.

For further details on PDM-h, the reader may refer to one of the following articles:

H. Schmid, B. Michel, Siloxane Polymers for High-Resolution, High-Accuracy Soft Lithography, Macromolecules 2000, 33, 3042-3049
Teri W. Odom, J. Christopher Love, Daniel B. Wolfe, Kateri E. Paul, and George M. Whitesides, Improved Pattern Transfer in Soft Lithography Using Composite Stamps, Langmuir, 18 (13), 5314-5320, 2002

The pad 34 is a multi-level pad comprising n levels of embossed patterns where n is an integer greater than or equal to two.

The pad 34 has a PDMS layer 120 having a flat bottom 122 pointing towards the substrate 32. This layer has a thickness between 0.1 micrometers to 10 mm, preferably between 1 μm and 1 mm.

N embossed pattern levels protrude from the layer 122 where n is an integer greater than two. These levels are classified by order of size going from the biggest to the smallest. Each level is formed by protrusions all having the same height $h_i$, where the index i designates the pattern level, the value "1" of the index i corresponding to the greatest height. The protrusions of each level i where i is strictly smaller than n demarcate an ith flat bottom placed between these protrusions. The i+1 level protrusions extend perpendicularly from the ith flat bottom. The level n protrusion or protrusions protrude from an nth flat bottom. In the case of the pad 34, the n flat bottoms are the same as one another. The height $h_{i-1}$ is measured relative to the ith flat bottom and perpendicularly to this flat bottom. The height $h_{i-1}$ is strictly smaller than the height $h_i$. Preferably, the height $_{-1}$ is at least twice as small as the height $h_i$ or at least ten times smaller than the height $h_i$.

The intermediate levels i with 1<i<n is used to enhance the precision, level by level, of the alignment of the pad with the substrate as well as to adjust it with respect to the parallelism of the level considered with the substrate. Using the principal of stops, it is possible (i) to place all the patterns of the same height in contact simultaneously whether the pattern is isolated on the surface of the pad or whether, on the contrary, it is a major part of the surface of the pad and (ii) to crush all the patterns of a same height simultaneously.

Here, all the protrusions are of the same material as the layer 120 and therefore form a single block with this layer.

Each protrusion has substantially vertical side faces which terminate at a flat end designed to take support on the substrate 32.

The horizontal section, i.e. in the plane XY, of each protrusion may be any unspecified section. For example, this section may have the shape of a cross, a circle, a square or again a rectangle. When the section is a highly elongated rectangle, the protrusion forms a ridge. The protrusions designed to deposit ink on the face of the substrate 32 have a shape factor between 0.2 and 2. The shape factor of a protrusion is defined by the ratio between its height $h_i$ and its smallest width L. Preferably, the shape factor is equal to one.

Each protrusion of a height $h_i$ is surrounded by an exclusion zone of a width Z. No lower-level pattern should be located in this exclusion zone. Indeed, this exclusion zone is designed to absorb deformations of the protrusion when it is strongly crushed against the face of the substrate 32. The smallest width $Z_i$ of the exclusion zone is inversely proportional to the Young's modulus of the elastomeric forming the protrusion and is proportional to the compression height. The compression height of a protrusion is equal to the difference between its height $h_i$ when it is not crushed against the substrate and the smallest height attained by this protrusion during pad printing.

For example, a pad with two levels, of which the Young's modulus is equal to 6 MPa, and with patterns of heights $h_1$=20 μm and $h_2$=2 μm, the width $Z_i$ is about 15 $h_1$ giving 300 μm. In this case, the compression height of the protrusions of the level 1 is equal to $h_1$-$h_2$.

Thus, generally, the smallest width of the exclusion zone $Z_i$ is greater than 15 $h_i$ and preferably greater than 25 $h_i$.

Thereafter, this proportion between the width $Z_i$ and the height $h_i$ was not kept in the FIGS. 5 to 24 to simplify these illustrations. The n−1 first levels are called "conformation patterns" because they enable the nth flat bottom to be paralelized with varying degrees of precision with the surface of the substrate. The nth pattern level is called a "printing pattern" because it is used to make the imprint on the substrate 32.

FIG. 11 represents the pad 34 in the particular case where n is equal to three.

The first level is formed by protrusions 124 with a height $h_1$. The two protrusions 124 which can be seen in FIG. 11 demarcate a first flat bottom 122A extending between these two protrusions 124. The flat bottom 122A is herein simply a particular zone of the flat bottom 122.

The height $h_1$ is the greatest of the heights $h_i$. This first level is used to parallelize the bottom 122A with the face of the substrate 32. To this end, the protrusions 124 form at least three supporting points on the face of the substrate 32. These supporting points are distributed on non-collinear axes and surround the bottom 122A.

Here, the horizontal section of the protrusions 124 is rectangular. The small side of this section extends in the direction X while the big side extends in the direction Y. The big side is for example three times longer than the small side. Thus, the supporting points are distributed along two orthogonal axes respectively, parallel to the directions X and Y. More specifically, each protrusion 124 forms two supporting points aligned along the axis parallel to the direction Y.

The vertical faces of the two protrusions 124 and the bottom 122A form a channel opening out on to the periphery of the pad 124. Thus, this channel prevents air from being trapped between the protrusions 124 when these protrusions are crushed against the substrate 32. The height $h_1$ is at least greater than half the measured value GBIR of the flatness of the substrate 32 and preferably greater and even several times greater than this measured value GBIR.

Here, the protrusions 124 are also used to align the pad 34 relative to the substrate 32. The position of the protrusions 124 in the horizontal plane can therefore be measured by means of a camera or any other means. To this end, in order that the position of the protrusions 124 can be measured by means of a camera, their smallest width $L_1$ is chosen to be at least greater than 1 μm.

The second level of the embossed pattern is formed by protrusions 130 with a height $h_2$. This is an intermediate conformation pattern used to obtain a more precise parallelization of a flat bottom 122B with the face of the substrate 32. For example, the horizontal section of the protrusions 130 is rectangular. The smallest side and the greatest side of this section extend so as to be parallel respectively to the directions X and Y.

The vertical faces of the two protrusions 130 and the bottom 122B also form a channel opening out on to the periphery of the pad 34. Thus, this channel prevents air from being trapped between the protrusions 130 when these protrusions are crushed against the substrate 32.

The smallest horizontal width of the protrusions 130 is denoted as $L_2$. Similarly to the first level, the protrusions 130 of the second conformation level form at least three supporting points on the face of the substrate 32 distributed on orthogonal axes parallel to the directions X and Y. These supporting points surround the second flat bottom 122B. These second-level protrusions 130 provide for a more precise parallelization of the bottom 122B with the face of the substrate 32.

The height $h_2$ should be greater than half the measured value $SBIR_{max}$ of the flatness of the substrate 32 and, preferably, greater or several times greater than this measured value. For the measurement of $SBIR_{max}$ it is assumed that the same imprint is printed by means of the pad 34 in several different printing zones of the face of the substrate 32. Each side then corresponds to a respective printing zone.

The third level is formed by protrusions 134 of a height $h_3$ protruding directly from the bottom 122B. The third flat bottom can thus be taken for the second flat bottom. The protrusions 134 are designed to print the imprint on the face 32. Here, the horizontal section of these protrusions 134, like that of the protrusions 130, is chosen to form an air escape channel with the bottom 122B. The height $h_3$ is greater than 0.5 times the measured value $SFQR_{max}$ of the flatness of the substrate 32. Preferably the height $h_3$ is at least greater than the measured value $SFQR_{max}$ of the flatness of the substrate 32. For the measured value $SFQR_{max}$, the sites taken into account are the same as in the case of the measured value $SBIR_{max}$. Here, the smallest width $L_3$ of the protrusions 134 is equal to the height $h_3$. The horizontal section of the protrusions 134 is for example rectangular and the greatest side of this section extends in the direction Y.

By way of an illustration, to make an imprint for which the smallest detail has a width of 1 micrometer, the heights $h_1$ to $h_3$ are the following: $h_1$=50 μm, $h_2$=10 μm and $h_3$=1 μm.

To make an imprint for which the width of the smallest detail is equal to 10 nm, the heights $h_1$ to $h_3$ are the following: $h_1$=1 000 nm, $h_2$=100 nm and $h_3$=10 nm.

The working of the device 30 shall now be described in greater detail with reference to the method of FIG. 12.

Initially, a phase 150 for manufacturing the pad 34 is performed. For example, this phase 150 starts with a step 152 for providing a silicon block 154 (FIG. 13). Typically, the flatness of the block 154 is at least equal to that of the substrate 32 and preferably better than that of the substrate 32.

Then, in a step 156, a negative etching is made of the conformation and printing patterns in the upper face of the block 150. For example, these patterns are etched by RIE (Reactive Ion Etching) because this method gives a greater shape factor, i.e. a shape factor greater than or equal to 1.5. Other methods such as the DRIE (Deep Reactive Ion Etching) or FIB (Focus Ion Beam) methods can also be used to etch conformation and printing patterns negatively in the block 154. At the end of the step 156 a mold or master model is obtained (see FIG. 14).

Then, at a step 158, the block 154 thus etched is used as a mold or master model to make the pad 34. For example, in this case, liquid PDMS is poured into this mold (see FIG. 15). Then, after polymerization, the black made of PDMS material is separated from the block 134 in order to obtain the pad 34. Advantageously, the external surface of the pad 134 can be modified with anti-adhesive treatment to facilitate the demolding.

Once the pad is made, it is inked at a step 160. Here, only the printing pattern is inked. For example, the inking is done by spraying ink on to the printing pattern or by ink-drop burst under vacuum or by any other appropriate method.

The ink is for example thiol, OTS (octadecyltrichlorosilane), dendrimers or biomolecules such as DNA, peptides or cells to be deposited on the substrate 32.

After the pad 34 has been inked, it is aligned in a step 162 along the axes X, Y and Z with the substrate 32. For example, at the step 162, the position along the axes X, Y and Z of the protrusions 124 is measured. Then, the actuators 72 and 74 are controlled according to these measurements by the computer 80 to align at least three of these protrusions 124 with the targets carried either by the substrate 32 or by the substrate-holder 70.

Figure 16:
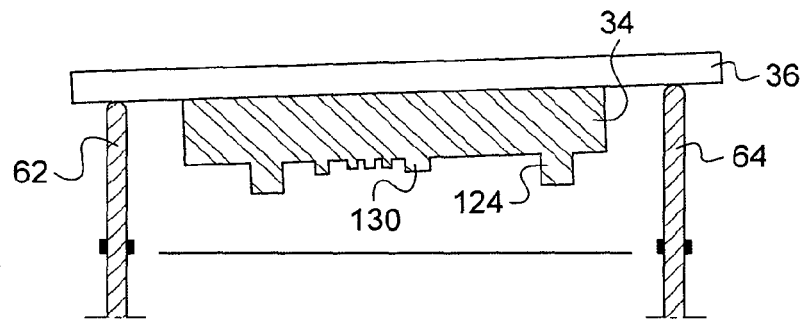

At a step 164, the jack 54 is controlled so as to shift the pad 34 along the direction Z until the pad-holder 36 is supported on the three stops 62 to 64. Initially, the height of the three stops 62 to 64 is adjusted so that none of the protrusions of the pad 34 is in contact with the substrate 32. An example of an initial position is illustrated in FIG. 16.

Then, a step 166 begins for calibrating the height of the stops to achieve a coarse parallelization of the bottom 122A with the face of the substrate 32.

During all the following steps and operations for adjusting the height of the stops 62 to 64, the pad-holder 36 is held so as to be supported on the stops 62 to 64 by the jack 54.

For example, the step 166 starts with an operation 170 for adjusting the height of the stops 62 to 64 to bring the pad into a first position where it is potentially flush with the face of the substrate 32. Then, the pad 34 is held still in this position in keeping the height of the stops 62 to 64 unchanged. In a subsequent operation 172, the sensor 60 is put into operation to enumerate the number of pads of the first level currently in contact with the upper face of the substrate 32 and to measure the area of the surfaces of the pads in contact with the substrate 32.

In an operation 174, the sum of the areas measured is compared with the sum of the areas measured is compared with the sum of the areas of the ends of the protrusions 124. If the sum of the areas measured represents more than 10% of the sum of the areas of the ends of the protrusions 124, then the method returns to the operation 170 where a new first position of being potentially flush is set by means of the stops 62 to 64. Indeed, in this case, the parallelism between the pad 34 and the substrate 32 is considered to be not good enough.

If not, in an operation 176, the computer 80 activates a reduction of the heights of the stops 62 to 64 that is simultaneous and at the same speed so that they go from the first determined flush position in the operations 170 to 174, to a first position of contact of the protrusions of the first level with the substrate 32. The first contact position is such that the thickness $D_1$ of the space between the bottom 122A and the face of the substrate 32 in this position is greater than $h_1/2$ and smaller than $h_1$. Preferably, the thickness $D_1$ ranges from $h_1/2$ to $9 h_1/10$. Indeed, in order to obtain a proper contact between a protrusion and the substrate, the height of the protrusion should preferably be reduced by $h_1/10$ when it is in contact with the face of the substrate. Typically, at the operation 176, the height of each of the stops is lowered by a travel distance $c_1$ greater than $h_1/10$ and in any case greater than twice the measured value GBIR of the flatness of the substrate. Then, in an operation 178, using the sensor 60, a measurement is made again of the number of protrusions 124 in contact with the substrate 32 and the area of these protrusions in contact with the substrate 32.

In an operation 180, the sum of the areas measured is compared with the sum of the areas of the ends of the protrusions 124. If the sum of the areas measured is smaller than 80% of the sum of the total areas of the ends of the protrusions 124, then the method returns to the operation 170. Indeed, this means that the parallelism between the pad and the substrate is not good enough. If not, an operation 182 is carried out for memorizing the last flush and contact positions found. In an operation 182, the pad 34 is kept in the first contact position for a time between 0.5 s and 10 s.

Figure 17:
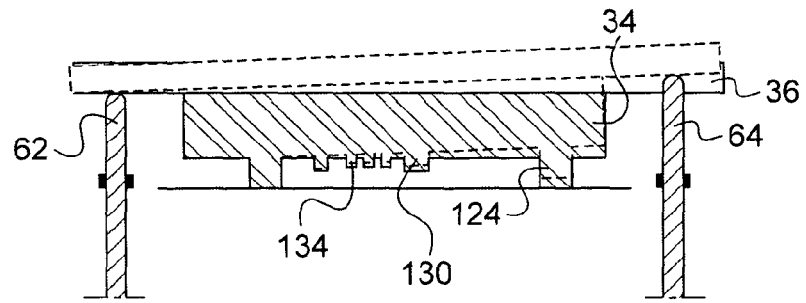

An example of an incorrect contact position calling for a return to the operation 170 is show in dashes in FIG. 17. In FIG. 17, a solid line also illustrates an example of a correct contact position.

At the end of the operation 182, a step 190 is performed for adjusting the parallelism of the bottom 122B with the face of the substrate 32. To this end, at the step 190, the protrusions 130 of the second level of conformation patterns is used.

The step 190 starts with an operation 192 for lowering the height of the stops 62 to 64 to a second potentially flush position in which the protrusions 124 are crushed against the face of the substrate 32 while the protrusions 130 are close to this face but do not touch it directly.

Then, operations 194 to 204 are performed. These operations 194 to 204 are respectively identical to the operations 172 to 182 except for the fact that the work is done with the protrusions 130 instead of the protrusions 124.

Figure 18:
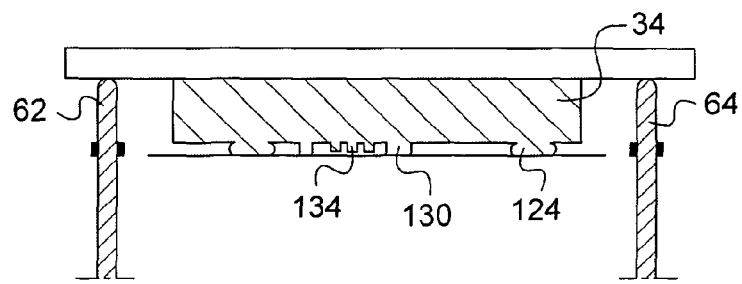

An example of a second accurate flush position is shown in FIG. 18.

At the end of the step 190, the downward movement of the pad 34 is stopped in a second contact position where the space of thickness $D_2$ of the space between the bottom 122B and the face before the substrate 32 is included between $h_2/2$ and $9 h_2/10$. The pad 34 is kept in this second position of contact for 0.5 s to 10 s.

Thus, before transferring the n-ranked pattern, the pad is put into contact only with the patterns of greater height so that the absence of contact of the n-ranked pattern with the substrate prevents any exchange of energy related to the work of adhesion of the surfaces. This exchange of energy which is known to deform the printing patterns is thus limited to the last step of the method, precisely for the duration needed for printing.

It is assumed here that the width of the protrusions of the printing pattern is so small that the contact of these printing patterns with the substrate 32 cannot be detected by means of the sensor 60.

Then, starting directly from the second contact position, a step 210 is performed for printing the imprint on the substrate 32. At the end of the step 210, in an operation 212, the height of the stops 62 to 64 is lowered simultaneously and at the same speed by a travel distance Δ starting from the second contact position so as to directly attain a third contact position. The third contact position is chosen to ensure that the thickness $D_3$ of the incompressible space between the bottom 122B and the face before the substrate ranges from $h_3/2$ to $9 h_3/10$. Thus, the protrusions 134 of the printing pattern are slightly compressed against the substrate 32 but in no case are they completely crushed against the substrate.

To this end, for example, the course A is given by the following relationship:

$$\Delta = 9(h_2-h_3)/10 + 3 \times \text{SFQR}_{max}$$

where $\text{SFQR}_{max}$ is the measured value $\text{SFQR}_{max}$ of the flatness of the substrate.

This travel distance ensures that the thickness $D_3$ is between $h_3/2$ and $9/h_3/10$.

Then, in an operation 214, the pad is held in this third contact position for a time varying from one 1 millisecond to 15 minutes and preferably for a time of 0.5 seconds to 10 seconds.

In fact, the time during which the printing pattern must be held in contact with the face of the substrate 32 depends on the ink and the substrate as well as the material used to make the pad. The following table gives a few examples of contact time as a function of the type of ink, pad or substrate used:

| Product to be transferred (ink) | Pad | Substrate | Contact time | Reference |
| --- | --- | --- | --- | --- |
| Octadecyltrichlorosilane (OTS) | PDMS | SiO$_2$/Si Al | 30 s | Jeon et al. Langmuir, 13 (13), 3382-3391 (1997) |
| OTS | PDMS | SiO2/Si | 5 s | Xia et al. JACS 117, 9576-9577 (1995) |
| n-Alkanethiols with the general formula: HS—(CH2)n—CH3 including: (i) hexadecanethiol (HDT, n = 15) (ii)octadecanethiol (ODT, n = 17) (iii) eicosanethiol (ECT, n = 19) | PDMS | Ag Au | 30 à 120 s | Balmer et al. Langmuir 21, 622-632 (2005) |
| HDT | PDMS | Ag Au | 5 s | Xia et al. Langmuir 12, 4033-4038 (1996) |
| HDT | PDMS | Au | 1 ms | Helmuth et al. JACS., 128, 9296-9297 (2006) |
| Dendrimers | PDMS-h | Pd | 20 s | Jang et al. Langmuir 22, 3326-3331 (2006) |
| DNA | PDMS | Chemically functionalized glass | 15 s to 2 minutes | Thibault et al. Journal of Nanobiotechnology 3:7 (2005) |
| DNA | PDMS | Functionalized glass | 15 s | Lange et al. Anal. Chem., 76 (6), 1641-1647 (2004) |
| Proteins | PDMS | Functionalized glass | 1-2 minutes | Inerowicz et al. Langmuir 18, 5263-5268 (2002) |
| Proteins | PDMS | | 1 s | Renault et al. J. Phys. Chem. B, 107 (3), 703-711 (2003) |
| Proteins | Agarose (hydrogel) | Functionalized glass | 10 s | Mayer et al. Proteomics 4, 2366-2376 (2004) |
| Cellules | Agarose | Hydroxypatite porous tissue | 15 minutes | Stevens et al. Biomaterials 26 7636-7641 (2005) |
| Bacteria | Agarose | Agar surface | 5 s | Weibel et al. Langmuir 21, 6436-6442 (2005) |

Once this contact time has elapsed, the computer again increases the height of the stops 62 to 64 at a step 220 to bring the pad 34 to its first and initial position where none of the protrusions of this pad are in contact with the substrate 32.

Many other embodiments are possible. For example materials other than PDMS may be used to make the pad 34. For example, poly(butyldiene), poly(dimethylsiloxane), poly(acrylamide), poly(butylstyrene) and their copolymers.

The above description, made in the case of the application of the pad 34 by a translation motion, can also be applied to a rotating pad in which the patterns come into contact with the substrate by a movement of rotation about an axis.

The shifting of the pad-holder to the substrate can also be obtained by shifting the substrate towards a fixed pad or by a combined motion of the pad and the substrate: the motion can be translational, rotational and/or a combination of the two.

For example, the means used to shift the pad-holder have been described here as a pneumatic jack. In other embodiments, these means for moving the pad-holder are a hydraulic jack or a motor-driven shaft with a dc stepping motor, a magnetic linear motor or any type of motor known to those skilled in the art. The shifting means can be manually controlled or computer-controlled with or without position control feedback systems.

Furthermore, the adjustable stop mechanism can be controlled or can be manually adjusted. It can be formed by motor-driven micrometer screws with a stepping motor or any other motor known to those skilled in the art with or without position control feedback. It can also be formed by motor-driven piezoelectric actuators with resolution of 1 to 10 nm and travel distance of 1 to 100 μm (see catalogue from the firms MElles Griot Inc. and Physik Instrument GmbH). According to a preferred embodiment, the adjustable stop measurement consists of a combined system: micrometer screws (motor-driven or manually shifted) to provide a wide course and a piezoelectric actuator with a position sensor and automatic feedback loop incorporated.

The stops 62 to 64 may be replaced by another stop mechanism such as a position control feedback system.

As a variant, the heightwise adjustable stops can form one piece with the pad-holder 36 and take support on the shoulder 66 forming one piece with the frame 48.

When the substrate is made of a material transparent to visible light, the sensor 60 can be placed beneath the substrate and not above it as described with reference to FIG. 7. This position is particularly well suited to situations where the substrate is made of glass and the pad is made out of an elastomeric material not transparent to visible light. For example the pad may be made of red Rhodorsil RTV 3255 with a Young's modulus in between that of PDMS-h and Sylgard 184.

The sensor 60 measures the difference between the pad and the substrate on a part of the pad and/or on a part of the substrate, for example on all or a portion of the patterns with a height $h_i$ with i=1 to n-1 and on the entire surface or a part of the surface of the substrate facing it in order to deduce therefrom an item of information on parallelism between an ith flat bottom and the substrate.

Advantageously, the detection principle is adapted to resolving the pattern of height $h_i$. It is then appropriate to change the detection principle as and when contact is made by crushing the different levels of the pad. Many sensors known to those skilled in the art can be implemented in the microprinting device. For example and as a non-exhaustive example, they may be based on direct observation with a camera by reflection or transmission, interferometry or moiré effect, by confocal or nonconfocal microscopy, fluorescence detection etc. A combination of these principals may also be implemented, especially fluorescence detection by confocal microscopy. The pad-substrate contact can be detected at points localized by means known to those skilled in the art, for example, by capacitive effect, tunnel effect or by the passage of an electrical current.

Advantageously, the substrate-holder can also be mounted rotationally about axes parallel respectively to the directions X and Y. Actuators are used to adjust the angular position of the substrate holder above these axes. This increases the precision of the adjustment of the pad-substrate parallelism.

The mold used to make the pad 134 can be made by depositing material as an overlay on a plain base face. For example, this material may be the negative photopolymerizable resin SU8.

Advantageously, the part of the pad in contact with the pad-holder is molded with a housing that can take the pad-holder or a protruding part of the pad-holder so as to set up a mechanical link without any degrees of freedom between the pad and the substrate.

The inking of the pad can be done at different times during the microprinting method. For example, in a first stage, all the flush and contact positions are determined and memorized. Then the pad is brought to its initial position and inked. During this inking the conformation patterns can also be inked. Then, the pad is successively moved from its initial position to the first memorized flush position and then to the first memorized contact position followed by a possible stop of 0.5 to 10 seconds and then to the second flush position and then to the second contact position and so on and so forth until the printing pattern is put into contact with the surface of the substrate.

Certain levels i of the pad can be metalized, chemically functionalized or inked differently from the level n printing pattern as well as the surface facing the substrate to facilitate the adjustment of the device at the level i. For example, the protrusions of the levels i (i<n) of the pad and possibly the facing surface of the substrate are metalized to create a detectable interference field or again to detect their contact by passage of an electrical current. In another variant, these levels can be inked with fluorophores in order to detect the pad-substrate contact by emission of fluorescence detected by confocal microscopy. The detection of the contact of these protrusions with the substrate is then used to adjust the parallelism between the pad and the substrate.

The time during which the pad is kept in each of the contact positions is not necessarily the same from one contact position to the next one. Indeed, the duration of the contact can be made to vary level by level.

Advantageously, all the pads implemented in a pad microprinting operation are referenced relative to a same starting point which facilitates the overlay of patterns on the substrate.

As a variant, an operation for aligning the pad with the substrate is done in each flush position of a pattern having at least one protrusion whose position along the axes X and Y can be measured. To this end, the pad microprinting device includes one or more sensors capable of measuring the position of this protrusion along the X and Y axes. Finally, the alignment operation consists of the alignment in the plane X, Y of the substrate with respect to the pad (or conversely) before the contact of the protrusions with a height $h_i$ of the pad (i=1 to n). To achieve this, the computer 80 sets the pad-substrate distance of the level i at the value $D_i$ with $h_i < D_i < 2 h_i$. In particular, for the levels i, where i is greater than 1, the setting implies friction of the levels i-1 to 1 on the substrate with possibly a zone of exclusion for printing the pattern to be defined on the substrate.

The printing pattern may comprise positioning protrusions with a height $h_n$ where the smallest width is at least twice and preferably at least ten times greater than the width $L_n$. The width $L_n$ is sufficient for the difference between this positioning protrusion and the substrate 32 to be capable of being measured by the sensor 60. Thus, through such positioning of protrusions, it is possible to carry out a more precise adjustment of the parallelism of the nth flat bottom with the face of the substrate 32.

The hinging 42 can be replaced with other known hinge systems and especially those described in the following publications:

K.-B. Choi and J. J. Lee, Review of Scientific Instruments 76, 075106-6 (2005).

H. Lan, Y. Ding, H. Liu, and B. Lu, Microelectronic Engineering 84, 684-688 (2007).

The pad 34 can be designed to cover the entire surface to be printed of the substrate 32 in a single pass. Conversely, the pad 34 can be designed to print an imprint solely on a particular site k of the surface to be printed on. Then, the pad or the substrate is shifted so as to obtain the same print but on another particular site of the same substrate. The pad microprinting method is then lengthier than the previous one but the adjusting of the parallelism of the pad with respect to a particular site of the substrate can be done site by site, providing for more precise printing. For example, for each particular site k, the parallelism of the pad and of the substrate is adjusted as a function of the $SFQR_k$ value and not that of the $SFQR_{max}$ value.

Figure 19:
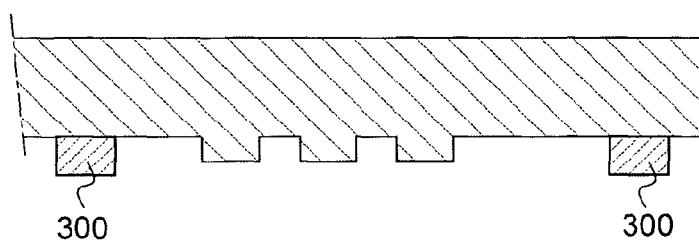
Figure 20:
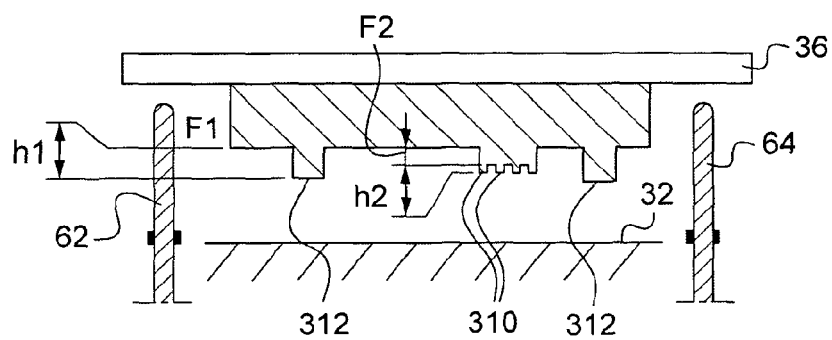

FIG. 19 shows a variant in which the protrusions 300 of the (n-1)th pattern level are made out of a rigid material i.e. out of a material for which the Young's modulus is greater than 1 GPa.

One way to reduce the width of the exclusion zone is to limit the compression height needed to pass from one level to the other. For example, FIG. 10 shows a multi-level pad in which the nth flat bottom can be taken for none of the other flat bottoms demarcated by the conformation levels. In FIG. 10, the pad is shown in the particular case where n is equal to 2. This pad has a first conformation pattern level formed by protrusions 312 and a second printing pattern level formed by protrusions 310. In this variant, the second flat bottom from which the protrusions 310 protrude, cannot be taken for the first flat bottom demarcated by the protrusions 312. Here, the second flat bottom and the first flat bottom are parallel. For example in FIG. 20, the second flat bottom is spaced from the first flat bottom by a distance $F_2$. The distance $F_2$ is such that a sum of this distance $F_2$ and of the height $h_2$ is strictly smaller than the height $h_1$ of the protrusions 312.

The compression height thus passes from $h_1$-$h_2$, if the first and second flat bottoms are indistinguishable from each other, to $h_1$-$h_2$-$F_2$. In taking $h_1$=10 μm, $h_2$=1 μm et $F_2$=7 μm, the compression height goes from 9 μm to 2 μm only, thereby concomitantly reducing the width of the exclusion zone. However, it is still greater than $h_1$/10 i.e. 1 μm, to provide for efficient contact of the first level on the entire surface of the pad.

This variant also has the advantage of limiting the travel distance needed to apply the printing pattern to the surface of the substrate.

Figure 21:
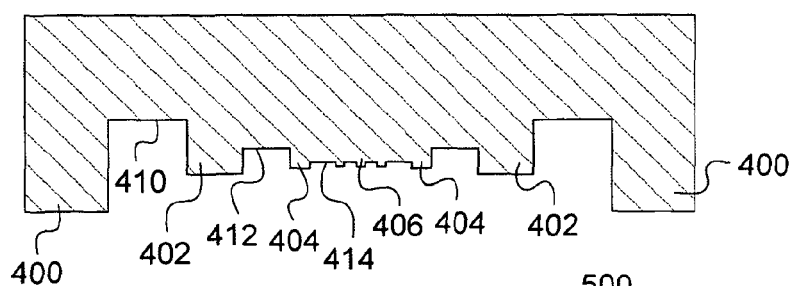

FIG. 21 is a pad with three conformation pattern levels and one printing pattern level. In this figure, the protrusions of the first second and third conformation pattern levels respectively bear the references 400, 402 and 404. The protrusions of the printing pattern bear the reference 406. The protrusions 400, 402 and 404 respectively demarcate flat bottoms 410, 412 and 414. The flat bottoms 410, 412, and 414 are parallel to one another and are not indistinguishable from each other. Thus, the pad has as many flat bottom levels as it has conformation pattern levels.

The pad 34 is not necessarily made only of elastomeric material. In particular the layer of elastomeric material can be preceded by other layers of different hardness values made out of different materials.

The pad may be constituted heterogeneously with elastomers having different Young's modulus values. For example, the pad may be constituted by successive overmolding of the different homogenous elastomers having different hardness values. The pad can also be constituted by the molding of a master model with the addition of detachable elements that are removed or added on during the molding in a manner similar to the methods used in plasturgy. It is thus possible to make conformation levels with a plastomer having a low Young's modulus so as to limit the width $Z_i$ of the exclusion zone and provide for printing patterns with a high Young's modulus so as to limit deformations during contact or again with a low interaction with the surface of the substrate so as to limit the influence of the work of adhesion. For example, the heterogeneous pad may be constituted by a sandwich structure of PDMS plastomer that is more rigid for the printing layer and more supple for the conformation patterns.

Figure 22:
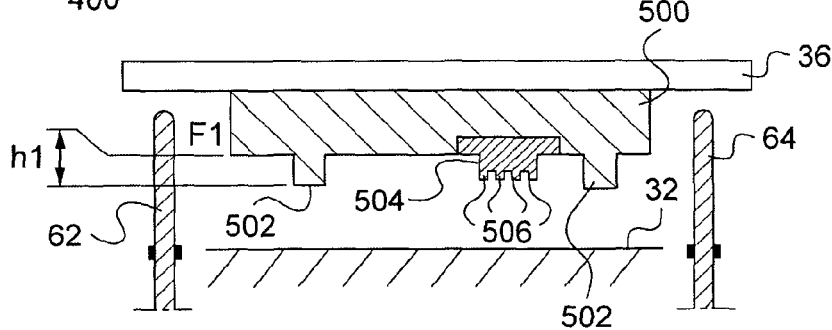

Another example of a pad constituted heterogeneously is represented in FIG. 22. FIG. 22 shows a pad 500 having a first level of conformation pattern formed by protrusions 502 and a printing pattern 504 formed by protrusions 506. In this variant, the printing pattern 504 is made out of an elastomeric material that is harder than the elastomeric material used to make the conformation pattern. For example, the elastomeric material used to make this printing pattern has a Young's modulus greater than 50 MPa and preferably greater than 90 MPa.

FIG. 23 represents a contactless method for printing an imprint on a substrate by pad microprinting. The method of FIG. 23 is for example identical to that of FIG. 12 except for the fact that the operation 212 is replaced by an operation 612. During the operation 612, the height of the stops 62 to 64 is adjusted to maintain the thickness $D_3$ of the incompressible space between $h_3$+1 nm and $h_3$+100 nm. Thus, the protrusions 134 of the printing pattern never come into contact with the face of the substrate. However, the space with a thickness of less than 100 nanometers between the end of the protrusions 134 and the face of the substrate is small enough to enable the ink to go through this space by ballistic diffusion. Thus, an imprint is formed by the face 32 without its being necessary to have direct contact between the protrusions of the printing pattern and the face of the substrate. This procedure prevents any exchange of energy related to adhesive stresses on the surfaces. This means that the protrusions of the printing pattern are not deformed, thus improving the quality of the print. The duration during which the thickness $D_3$ is maintained is between a minimum duration needed to provide for the transfer of the printing pattern to the substrate and a maximum duration that leads to deterioration of the imprint by diffusion. This duration may be determined experimentally.

FIG. 24 is a variant of the device 30 in which adjustable stops 620, such as the piezoelectric actuators, with a vertical sense of motion, are distributed between the pad-holder 36 and the pad 34. In FIG. 24, only one adjustable stop 620 has been shown. More specifically, each of these stops has a supporting point on one face of the pad-holder pointed towards the substrate 32 and another supporting point on the upper face of the pad 34. Thus, each of these stops is capable of locally modifying the curvature of the pad by varying the distance between its supporting points. Each of these stops can be controlled by the computer 80.

Furthermore, the device 30 has a sensor 622 of defects of flatness on the substrate 32. For example, this sensor is capable of measuring the amplitude in the direction Z of each flatness defect. This sensor can also measure the position in the plane X, Y of each of the flatness defects. The sensor 622 is connected to the computer 80.

During the printing method, the sensor 622 measures the flatness defects of the substrate 32 and then crushes the pad 34 against the substrate 32 or at the same time as the pad 34 is crushed on the substrate 32. Then, the computer 30 adjusts the height of the stops 620 to match the curvature of the pad 34 with the curvature of the substrate 32 as illustrated in FIG. 24. For example, to this end, the same techniques are used as those described in the case of thin-mirror telescopes which are mounted on a set of piezoelectric actuators to correct the curvature of the mirrors online as a function of atmospheric turbulence.

Thus, the parallelism between the pad and the substrate can be improved even as the surfaces facing each other have a large number of peaks, valleys and ridges.

Adjustable stops can also be laid out between the substrate 32 and the substrate-holder 70 so as to locally modify the curvature of the substrate. What has been described with reference to the stop 622 applies identically to the stops between the substrate 32 and the substrate-holder 70.

The teachings given here in the particular case of a pad with two and three levels can also be applied to a pad with more than three or four or even more pattern levels.

The contactless pad microprinting method in which the printing pattern never comes into contact with the face of the substrate can be implemented independently of the use of a multi-level pad.

The stop 62 to 64 distributed on two non-collinear axes for the adjusting or simultaneous modification of the heights of the stops may be implemented independently of the multi-level pad. Similarly, the use of adjustable stops between the pad-holder and the pad or between the substrate-holder and the substrate can be implemented independently of the use of a multi-level pad.

More generally, the characteristics of any one of the independent claims and especially the characteristics of the characterizing parts can be replaced by the characteristics of any one of the dependent claims.

The invention claimed is:

1. A pad comprising:
a layer of elastomeric material having a first flat bottom from which there protrude n successive levels of embossed patterns, classified in descending order of height $h_i$, where n is an integer greater than or equal to two, and wherein i is an index that represents the pattern level, with i being equal to one for the pattern for which the height $h_i$ is the greatest,
a first pattern level, said first pattern level being a conformation level, enabling the first flat bottom to be coarsely parallelized with a face of a substrate, said pattern being formed by several protrusions of a height $h_i$, said protrusions defining at least three non-collinear support points on said face and around the first flat bottom, the height $h_i$ being measured relative to said first flat bottom and in a direction perpendicular to said first flat bottom, and
an $n^{th}$ pattern level, said $n^{th}$ pattern level being a printing level, capable of coming into contact with the face of the substrate solely after the $(n-1)^{th}$ pattern level has thus been put into contact with said face, to print the imprint on the face of the substrate, said pattern being formed by one or more protrusions having a height $h_n$ projecting perpendicularly from an $n^{th}$ flat bottom that is the same as or is parallel to the first flat bottom and that is situated between the three supporting points of the first pattern level, the height $h_n$ being between $h_{n-1}/2$ and $0.5 \times SFQR_{max}$, where $SFQR_{max}$ (Max Site Frontside least sQuare focal plane Range) is a standardized measurement of flatness of the substrate, the height $h_n$ of each protrusion being measured relative to the $n^{th}$ bottom plate and perpendicularly to said $n^{th}$ bottom plate,
wherein for each pattern of height $h_i$ with i strictly smaller than n, an exclusion zone of width $Z_i$ surrounding each protrusion of height $h_i$ and in which no lower pattern is located, the width $Z_i$ being greater than or equal to $15h_i$, and
wherein the printing pattern is made out of an elastomeric material having a Young's modulus between 0.10 and 100 MPa.

2. The pad of claim 1, further comprising at least one intermediate level i of conformation patterns enabling a more precise parallelization of the $n^{th}$ flat bottom with the face of the substrate on which the imprint must be printed, each intermediate level i being formed by several protrusions having a height $h_i$ above a standardized SBIR (Site Backside Ideal focal plane Range) measurement of flatness of the substrate and below $h_{i-1}/2$, where $h_{i-1}$ is the height of the protrusions of level i-1 the just greater conformation pattern, said protrusions defining at least three non-collinear supporting points arranged around the $n^{th}$ flat bottom.

3. The pad of claim 1, further comprising at least one air escape channel linking a space, situated between the protrusions of each pattern level, to the exterior of the pad in order to enable air likely to be imprisoned between the substrate and the pad to escape out of the pad when the pad is thrust against the face of the substrate.

4. The pad of claim 1, wherein the height $h_n$ is less than or equal to 100 micrometers.

5. The pad of claim 1, wherein the height $h_n$ is less than or equal to 1 micrometer.

6. The pad of claim 1, wherein the height $h_n$ is less than or equal to 0.3 micrometers.

7. The pad of claim 2, further comprising at least one air escape channel linking a space, situated between the protrusions of each pattern level, to the exterior of the pad in order to enable air likely to be imprisoned between the substrate and the pad to escape out of the pad when the pad is thrust against the face of the substrate.

8. The pad of claim 7, wherein the height $h_n$ is less than or equal to 100 micrometers.

9. The pad of claim 7, wherein the height $h_n$ is less than or equal to 0.3 micrometers.

10. The pad of claim 1, wherein the printing pattern is made out of an elastomeric material having a Young's modulus of between 10 and 100 MPa.

11. The pad of claim 1, wherein the width $Z_i$ is greater or equal to $25h_i$.

12. The pad of claim 1, wherein the shape factor of the protrusions of the printing level is between 0.2 and 2, wherein the shape factor is defined as a ratio between height $h_i$ and smallest width $L_i$.

13. The pad of claim 1, further comprising an air escape channel linking a space between each of said protrusions and the exterior of the pad to enable air to avoid imprisonment between the substrate and the pad by escaping out of the pad when the pad is thrust against the face of the substrate.

* * * * *